United States Patent [19]

Ham et al.

[11] Patent Number: 5,244,821
[45] Date of Patent: Sep. 14, 1993

[54] BIPOLAR FABRICATION METHOD

[75] Inventors: Thomas E. Ham, Allentown; John W. Osenbach, Kutztown; Morgan J. Thoma, Macungie; Susan C. Vitkavage, Zionsville, all of Pa.

[73] Assignee: AT&T Bell Laboratories, Murray Hill, N.J.

[21] Appl. No.: 712,316

[22] Filed: Jun. 7, 1991

[51] Int. Cl.$^5$ .......................................... H01L 21/265
[52] U.S. Cl. ........................................ 437/31; 437/28; 148/DIG. 10
[58] Field of Search .................. 437/31, 28, 154, 33, 437/979, 162; 148/DIG. 10, DIG. 163

[56] References Cited

U.S. PATENT DOCUMENTS

| | | | |
|---|---|---|---|
| 3,756,861 | 9/1973 | Payne et al. | 437/28 |
| 4,236,294 | 12/1980 | Anantha et al. | 437/67 |
| 4,764,482 | 8/1988 | Hsu | 437/31 |
| 4,839,302 | 6/1989 | Kameyama et al. | 437/31 |
| 4,874,712 | 10/1989 | Kim et al. | 437/31 |
| 4,927,775 | 5/1990 | Alvarez et al. | 437/162 |
| 4,983,531 | 1/1991 | Cosentino | 437/31 |
| 4,997,775 | 3/1991 | Cook et al. | 437/162 |
| 5,008,208 | 4/1991 | Liu et al. | 437/162 |
| 5,013,671 | 5/1991 | Havemann | 437/31 |
| 5,013,672 | 5/1991 | Zambrano | 437/28 |

*Primary Examiner*—Brian E. Hearn
*Assistant Examiner*—Tuan Nguyen
*Attorney, Agent, or Firm*—David L. Smith; John T. Rehberg

[57] ABSTRACT

A method for forming a bipolar transistor is disclosed. An optional thin screen oxide ($\approx 150$ Å) may be formed upon a substrate over an already-defined collector region. A BF$_2$ or other implantation is performed through the screen oxide to create the base. The screen oxide is removed and replaced with a patterned high pressure oxide so that the emitter may be defined. The resulting device has a more controllable Gummel number and breakdown voltage.

15 Claims, 1 Drawing Sheet

BIPOLAR FABRICATION METHOD

FIELD OF THE INVENTION

This invention relates to transistor fabrication methods in general and, more particularly, to methods for producing bipolar integrated circuits.

BACKGROUND OF THE INVENTION

Typical bipolar fabrication techniques involve forming a base region by directing an implant species into an already-formed collector region. In a typical process, the surface of the silicon substrate is covered with approximately 800–1400 Å of oxide. The thickness of the oxide is chosen to prevent subsequent ion channeling and provide emitter-base isolation. The base implant energy and dose are chosen in such a way as to insure that the peak base dose occurs at the oxide/silicon interface and that the total base dose yields a Gummel number between $1 \times 10^{12}$ and $4 \times 10^{12}$ atoms/cm$^2$.

However, in a production environment, it is difficult to precisely control the thickness of the oxide. Often, there may be a variation within or between wafers or from lot to lot of as much as 10% in oxide thickness. Since the oxide thickness essentially governs the base dose and profile, there may be a substantial variation in the total amount of impurity doping in the base and the base width. Thus, there may be a substantial variation in the Gummel number of the base and the base profile and width, and substantial variation in transistor performance.

For many bipolar transistors, especially those with polysilicon emitters, thick oxide is required over the base to isolate the base from the external circuit or from capacitive effects of the polysilicon emitter. The comparatively thick (800–1400 Å) oxide is grown before implantation because growth after implantation would cause undue base diffusion which increases the base width and therefore causes a significant degradation in transistor performance.

SUMMARY OF THE INVENTION

The present invention helps to provide, among other advantages, a more controlled base doping while maintaining a high performance controllable transistor. Illustratively, the invention includes:
  forming a collector region in a substrate;
  implanting a dopant species into the collector, thereby forming the base region;
  forming a patterned material layer over the substrate; and forming an emitter region.

In an illustrative embodiment, a thin ($\approx 150$ Å) material layer may be formed over the substrate prior to implantation. The thin material (typically an oxide) insures that the base doping remains more constant from device to device by reducing ion channeling and by reducing the number of "knock-on" ions which may otherwise strike the substrate. In other embodiments, the thin material layer may be omitted altogether prior to implanting.

DETAILED DESCRIPTION

Figure 1:
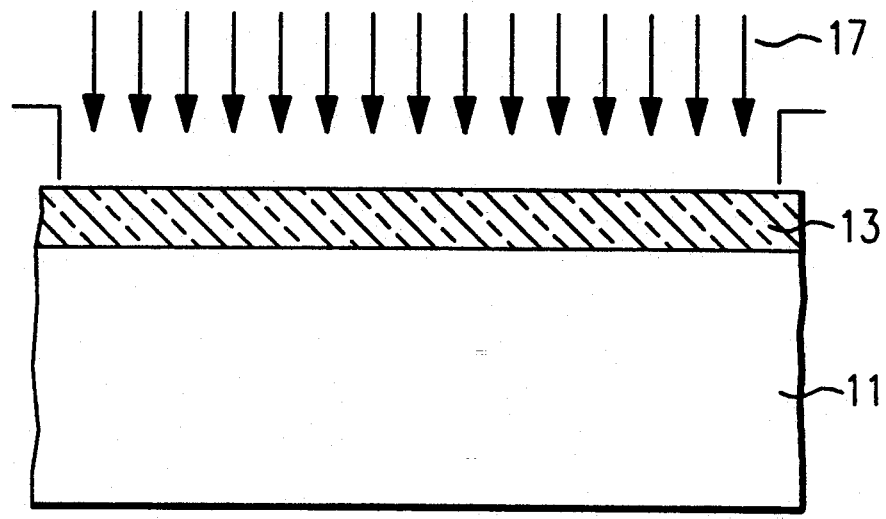
FIGS. 1 and 2 are cross-sectional views depicting the steps of an illustrative embodiment of the present invention.

Reference numeral 11 designates the already-formed collector region. Layer 13 is a screen oxide of approximately 150 Å thick. Typically, layer 13 is formed by atmospheric thermal oxidation. However, other techniques may be used. The use of layer 13 is optional, although it provides certain advantages. For example, the presence of layer 13 helps to prevent channeling of the subsequently implanted ions through the collector lattice. In addition, it absorbs the "knock-on" ions which may otherwise strike the substrate after being dislodged from the metal walls of the implantation apparatus.

Next, an implantation of BF$_2$ and/or boron is performed through screen oxide 13. In contrast to previous practice, the peak of the implant dose concentration is not tailored to occur at the interface between the collector and the oxide. Instead, the peak concentration occurs approximately 250 Å below the interface between the oxide and collector. A variety of doses and energies may be used, for example, 3E14, 60 KeV of BF$_2$, 4E13 of boron (35 KeV), or 8E13 of BF$_2$ and 2E13 boron (35 KeV). Other doses and energies may be determined by those skilled in the art. The implantation produces the base region designated by reference numeral 21 in FIG. 2. (Of course, the above prescription provides for the formation of an npn transistor. Should a pnp transistor be desired, a phosphorous or arsenic implant would be performed into a p-type collector.)

Next, oxide layer 15 is grown by a high-pressure oxidation process. (If desired, screen oxide 13 may be stripped away first although not shown in the figures which illustrate the screen oxide remaining generally above oxide layer 15.) Typically, for example, oxide layer 15 may be formed at a pressure of 15 atmospheres for a time approximately equal to four minutes in steam. Other fast oxidation processes which minimize base diffusion such as flourine-enhanced oxidation or rapid thermal oxidation may also be used. After layer 15 has been formed, it is patterned. The high pressure oxidation process is comparatively fast and can be done at relatively low temperature. Thus, there is no deleterious diffusion of the base dopant with its attendant degradation of transistor performance.

Figure 2:
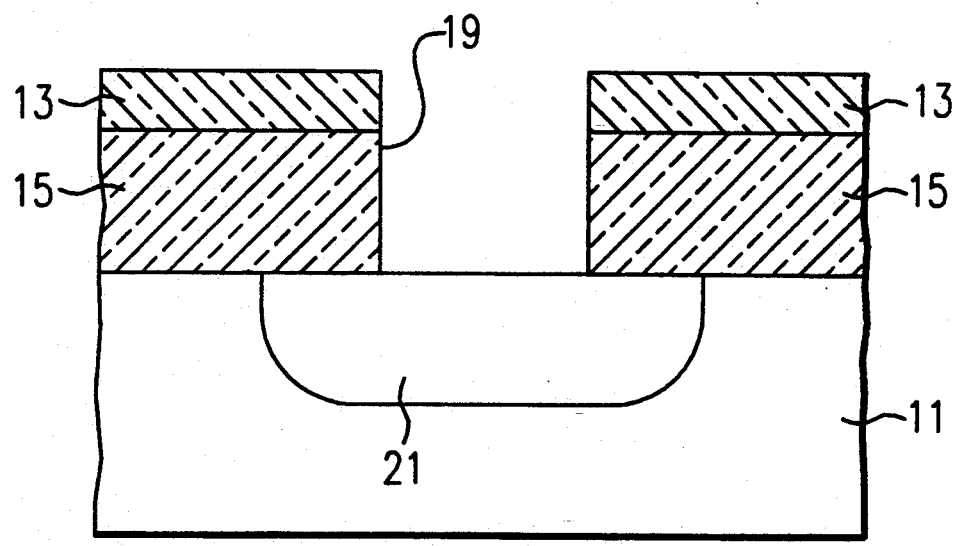

FIG. 2 shows patterned layer 15 (with layer 13 above it, assuming that layer 13 has not been removed). The thickness of layer 15 is approximately 1400 Å. The exact thickness is process-dependent and may range between 800–1700 Å.

Patterning of layer 15 produces opening 19 through which an emitter may be eventually formed by processes such as arsenic implantation.

Previously-used techniques for forming the base region have involved a boron implantation through approximately 800–1400 Å of oxide (as opposed to the comparatively thin screen oxide 13 in FIG. 1). However, in typical production environments there may be a variation of as much as 10% in oxide thickness for thick oxides. Consequently, for an oxide of 1200 Å thickness, the oxide through which the boron is implanted may, for example, range from 1080 to 1320 Å. Thus, the Gummel number (i.e., the total base dose under the emitter) depends upon the oxide thickness. Consequently, there is an undesirable variation from device to device of the Gummel number. Variation in Gummel number causes variation in transistor gain and emitter base breakdown.

Previously used techniques permit larger dopant concentrations near the base surface, leading to low emitter-base breakdown voltages (i.e., less than six volts). The present method provides a lower dopant concentration near the collector surface and permits higher breakdown voltages (i.e., greater than six volts).

Furthermore, applicants' inventive technique provides devices with higher emitter-base breakdown voltages, and better control over base width and transistor gain. When no screen oxide is used, the Gummel number of applicants' transistors is governed by the implant dose and energy (and is not affected by variations in the thickness of a thick oxide) and is thus more consistent from device to device.

We claim:

1. A method of integrated circuit fabrication comprising:
   forming a bipolar collector region in a substrate;
   forming a first material layer over at least portions of said substrate;
   implanting a dopant species through said first material layer into a portion of said collector, thereby forming a base region;
   forming by rapid growth a second material layer on said substrate over at least said base region;
   patterning said second material layer to form a window over said base region; and
   forming an emitter region through said window.

2. The method of claim 1 wherein said first material layer is an oxide of silicon.

3. The method of claim 1 in which said first material layer has a thickness of 150 Å±10%.

4. The method of claim 1 in which said dopant species is chosen from the group consisting of boron and BF$_2$.

5. The method of claim 1 in which said dopant species is chosen from the group consisting of phosphorous and arsenic.

6. The method of claim 1 in which said second material layer is formed by a process chosen from the group consisting of high pressure oxidation, flourine-enhanced oxidation, and rapid thermal oxidation.

7. The method of claim 1 in which said second material layer is formed by high pressure oxidation at approximately 15 atmospheres in steam.

8. A method as recited in claim 1, further comprising the step of removing the first material layer before growing the second material layer.

9. The method of integrated circuit fabrication as recited in claim 1, wherein the step of implanting the dopant species further comprises implanting the dopant species such that the implant dose concentration peak occurs approximately 250 Å into the collector region from the interface of the first material layer and the collector.

10. A method of integrated circuit fabrication comprising:
    forming a bipolar collector region in a substrate;
    forming a first material layer over at least portions of said substrate, said first material layer comprising an oxide of silicon;
    implanting a dopant species through said first material layer into a portion of said collector, thereby forming a base region;
    forming by high pressure oxidation at about 15 atmospheres in steam a second material layer on said substrate over at least said base region, said second material layer comprising an oxide of silicon;
    patterning said second material layer to form a window over said base region; and
    forming an emitter region through said window.

11. The method of claim 10 in which said first material layer has a thickness of 150 Å±10%.

12. The method of claim 10 in which said dopant species is chosen from the group consisting of boron and BF$_2$.

13. The method of claim 10 in which said dopant species is chosen from the group consisting of phosphorous and arsenic.

14. The method of claim 10, further comprising the step of removing the first material layer before growing the second material layer.

15. The method of integrated circuit fabrication as recited in claim 10, wherein the step of implanting the dopant species further comprises implanting the dopant species such that the implant dose concentration peak occurs approximately 250 Å into the collector region from the interface of the first material layer and the collector.

* * * * *